United States Patent
Wallner

(10) Patent No.: US 9,103,883 B2
(45) Date of Patent: Aug. 11, 2015

(54) METHOD AND EVALUATION DEVICE FOR CHECKING PLAUSIBILITY OF AN INCREMENTAL COUNTER

(71) Applicant: Lorenz Wallner, Fürth (DE)

(72) Inventor: Lorenz Wallner, Fürth (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 14/172,160

(22) Filed: Feb. 4, 2014

(65) Prior Publication Data

US 2014/0219413 A1   Aug. 7, 2014

(30) Foreign Application Priority Data

Feb. 6, 2013  (EP) .................................... 13154230

(51) Int. Cl.
- *H03K 3/00* (2006.01)
- *G01R 31/3181* (2006.01)
- *G01D 5/244* (2006.01)

(52) U.S. Cl.
CPC ........ *G01R 31/3181* (2013.01); *G01D 5/24461* (2013.01)

(58) Field of Classification Search
USPC ......................................................... 377/112
See application file for complete search history.

(56) References Cited

U.S. PATENT DOCUMENTS 7,312,793 B2 * 12/2007 Chida ........................... 345/213

FOREIGN PATENT DOCUMENTS

| DE | 19860378 A1 | 6/2000 |
| DE | 10240834 A1 | 3/2004 |

* cited by examiner

*Primary Examiner* — Daniel Puentes
(74) *Attorney, Agent, or Firm* — Cozen O'Connor

(57) ABSTRACT

A method and evaluation device for checking plausibility of an incremental counter, wherein counting pulses are detectable via the incremental counter, and wherein a dynamic system generates the counting pulses with a clock rate corresponding to a state of the dynamic system. Here, a minimum value and a maximum value for a possible or permitted change in the clock rate per time unit is predefined based on operating limits of the dynamic system, wherein a current clock rate is calculated in each case from two counting pulses respectively detected last, and wherein at each newly detected counting pulse the counting pulse is checked to determine if the difference between the clock rate calculated in the course of the newly detected counting pulse and a clock rate calculated immediately beforehand is within the limits defined by the minimum value and maximum value, wherein otherwise implausibility is detected.

17 Claims, 3 Drawing Sheets

FIG 2

| Amax | 0.01 |
| --- | --- |
| Amin | -0.01 |

| Cycle | P | Pulse? | Vact | Vmin | Vmax | Pmin | Pmax | trunc(Pmin) | trunc(Pmax) | Error? |
| --- | --- | --- | --- | --- | --- | --- | --- | --- | --- | --- |
| 0 | 5000 | Yes | 0.1 | 0.1 | 0.1 | 4999.9 | 5000.1 | 4999 | 5000 | No |
| 1 | 5000 | No | 0.1 | 0.09 | 0.11 | 4999.99 | 5000.21 | 4999 | 5000 | No |
| 2 | 5000 | No | 0.1 | 0.08 | 0.12 | 5000.07 | 5000.33 | 5000 | 5000 | No |
| 3 | 5000 | No | 0.1 | 0.07 | 0.13 | 5000.14 | 5000.46 | 5000 | 5000 | No |
| 4 | 5000 | No | 0.1 | 0.06 | 0.14 | 5000.2 | 5000.6 | 5000 | 5000 | No |
| 5 | 5001 | Yes | 0.2 | 0.2 | 0.2 | 5000.4 | 5000.8 | 5000 | 5000 | Yes |
| 6 | 5001 | No | 0.2 | 0.2 | 0.2 | 5000.8 | 5001.2 | 5000 | 5001 | No |
| 7 | 5001 | No | 0.2 | 0.19 | 0.21 | 5000.99 | 5001.41 | 5000 | 5001 | No |
| 8 | 5001 | No | 0.2 | 0.18 | 0.22 | 5001.17 | 5001.63 | 5001 | 5001 | No |
| 9 | 5001 | No | 0.2 | 0.17 | 0.23 | 5001.34 | 5001.86 | 5001 | 5001 | No |
| 10 | 5001 | No | 0.2 | 0.16 | 0.24 | 5001.5 | 5002.1 | 5001 | 5002 | No |
| 11 | 5001 | No | 0.2 | 0.15 | 0.25 | 5001.65 | 5002.35 | 5001 | 5002 | No |
| 12 | 5001 | No | 0.2 | 0.14 | 0.26 | 5001.79 | 5002.61 | 5001 | 5002 | No |
| 13 | 5001 | No | 0.2 | 0.125 | 0.125 | 5001.915 | 5002.735 | 5001 | 5002 | No |
| 14 | 5001 | No | 0.2 | 0.115 | 0.135 | 5002.03 | 5002.87 | 5002 | 5002 | Yes |
| 15 | 5002 | Yes | 0.1 | 0.1 | 0.1 | 5002.13 | 5002.97 | 5002 | 5002 | No |
| 16 | 5002 | No | 0.1 | 0.09 | 0.11 | 5001.9 | 5002.1 | 5001 | 5002 | No |
| 17 | 5002 | No | 0.1 | 0.08 | 0.12 | 5001.98 | 5002.22 | 5001 | 5002 | No |
| 18 | 5002 | No | 0.1 | 0.07 | 0.13 | 5002.05 | 5002.35 | 5002 | 5002 | No |
| 19 | 5002 | No | 0.1 | 0.06 | 0.14 | 5002.11 | 5002.49 | 5002 | 5002 | No |
| 20 | 5002 | No | 0.1 | 0.05 | 0.15 | 5002.16 | 5002.64 | 5002 | 5002 | No |

METHOD AND EVALUATION DEVICE FOR CHECKING PLAUSIBILITY OF AN INCREMENTAL COUNTER

BACKGROUND OF THE INVENTION

1. Field of the Invention

The invention relates to a method for checking the plausibility of an incremental counter, and to an evaluation device for checking the plausibility of the incremental counter.

2. Description of the Related Art

In order to detect digital pulses, incremental counters are used in measuring and control equipment. In a simple case, this equipment is composed of a mechanical or electronic counter module, where square-wave signals are usually detected with respect to rising or falling edges, or "zero crossovers". An important application is the detection of the position or movement of machines, such as electric motors or driven axles of machine tools. In this context, it is often customary to detect what is referred to as a "quadrature signal", via which it is also possible to detect a direction of movement, with the result that after an index switch is passed through once or a "zero position" is approached once, a counter reading of the incremental counter always provides information about the absolute position of an observed object or the attitude of a monitored rotor or the like. From the time reference between successive counting pulses, it is also possible to determine a parameter such as a clock rate, a movement speed, angular speed or rotational speed of an observed mechanical system.

If electrical interference ("interference pulses") occurs on a signal line with which the counting pulses are fed to evaluation electronics or to an evaluation circuit, the evaluation electronics could incorrectly interpret this interference also as counting signals, as a result of which the counter reading of the incremental counter ("position value") would be falsified and, moreover, the clock rate or the speed of the observed mechanical system would be detected incorrectly. The same applies if an actually triggered counting pulse is not detected by the incremental counter owing to an interruption or some other fault, as a result of which incorrect position information and, under certain circumstances, also an incorrect clock rate or speed of an observed mechanical system is also detected or measured.

The evaluation logic for incremental encoders, i.e., the incremental counters from the prior art, typically have filters that typically allow only counting signals below a specific frequency to pass through, where a maximum counting frequency or clock rate or speed is then automatically produced. Such filters can be implemented, for example, in an analogous manner by a correspondingly dimensioned RC element in the signal line, or else also as a digital filter, implemented, for example in a digital controller. In the case of rapid counting signals, in surroundings that are subject to a large amount of interference or when unshielded signal cables are used, it is possible, however, that pure filtering based on the signal frequency is not sufficient. Likewise, counting pulses that are suppressed erroneously, for example, due to brief interruptions in the signal line, cannot be found or suppressed because counting pulses that have been lost cause the signal frequency to be lowered. However, the described RC element or a corresponding digital filter constitutes a low-pass filter that is therefore not capable of detecting or filtering out such interference. In addition, it is possible in applications, for example, in the control of movements, which are programmed in stored-program controllers to perform plausibility checking of the detected speed in positioning systems, i.e., for example, to check whether a defined maximum speed or maximum clock rate has been exceeded. This plausibility checking is typically perform in the control clock of the stored-program controller, i.e., once in each cycle of the controller. In the case of customary cycle times of stored-program controllers, such as a millisecond, and the customary movement speeds of mechanical axles with a corresponding resolution of the signal pickups this means, however, that the counter reading of the incremental counters can change considerably from cycle to cycle, i.e., a multiplicity of counting pulses is detected between two cycles. It is therefore not possible to detect individual interference pulses that are erroneously interpreted as counting pulses if the proportion of interference pulses in the sum of detected counting pulses is comparatively low. Likewise, sporadic interruptions, which only suppress a comparatively small proportion of the actual signal pulses between two control cycles, likewise cannot be detected with this method.

SUMMARY OF THE INVENTION

It is therefore an object of the present invention to examine more precisely the counting pulses detected with an incremental counter. Furthermore, interference which can cause counting pulses to be suppressed is to be detected.

These and other objects and advantages are achieved in accordance with the invention by providing a method and evaluation device in which each individual detected counting pulse is checked to determine whether the time of detection of this counting pulse is at all plausible or possible in terms of the dynamic properties of the observed mechanical system. This means that for each counting pulse a check is performed to determine whether the new counter reading could have been reached at all by the mechanical system with the speed detected until then and a possible acceleration of the observed system of the "real world". Such checking can be made to occur upstream of a stored-program controller or another microprocessor system, i.e., can be performed in a signal processor itself. For example, such plausibility checking can be carried out by a programmable logic module (for example FPGA—Field Programmable Gate Array), where the maximum acceleration/deceleration that is possible in this way, and if appropriate, maximum and minimum speeds only have to be predefined as operating limits of the observed dynamic system. If counting pulses are detected whose evaluation describes such a maximum acceleration/deceleration or maximum speed of the mechanical system that the real mechanical system cannot achieve at all, a fault is assumed. The same also applies to counting pulses that erroneously fail to occur and also indicate such a deceleration (negative acceleration) that the real system likewise cannot have at all owing to a moved mass and limited braking powers or the like.

In accordance with the method of the invention, the plausibility of an incremental counter is checked, where counted pulses can be detected via an incremental counter, and where a dynamic system generates the counting pulses with a clock rate corresponding to a state of the dynamic system. In this context, a minimum value and a maximum value for a possible or permitted change in the clock rate per time unit is predefined based on operating limits of the dynamic system, where during a first step a current clock rate is calculated in each case from two counting pulses respectively detected last, and where, in a second step, at each newly detected counting pulse the counting pulse is checked to determine if the difference between the clock rate calculated in the course of the newly detected counting pulse and a clock rate calculated immediately beforehand is within the limits defined by the minimum value and maximum value, where otherwise implausibility is detected. The method in accordance with the invention makes it possible to check the counting pulses individually to determine whether they are plausible in terms of the dynamic possibilities of an observed mechanical system.

The object of the invention is also achieved via an evaluation device for checking the plausibility of an incremental counter, where counting pulses can be detected via the incremental counter, and where a dynamic system generates the counting pulses with a clock rate corresponding to a state of the dynamic system. In this context, a minimum value and a maximum value for a possible or permitted change in the clock rate per time unit is predefined based on operating limits, where the evaluation device is configured such that, in a first step, a current clock rate is calculated in each case from the two counting pulses respectively detected last, and that, in a second step, at each newly detected counting pulse the counting pulse is checked to determine if the difference between the clock rate calculated in the course of the newly detected counting pulse and a clock rate calculated immediately beforehand is within the limits defined by the minimum value and maximum value, where otherwise implausibility is detected. Such an evaluation device can implement the advantages specified for the method.

The object is achieved advantageously in practice via a calculation method that repeats cyclically, where in each cycle values are updated for the minimum and maximum rate of change (speed) and for a minimum and maximum possible counter reading (position) of the incremental counter. As a result, a linear profile of the values for the minimum or maximum possible speed and a quadratic or parabolic profile of the values for the minimum or maximum possible counter reading (position) is obtained for a constant minimum or maximum acceleration (or deceleration). After a new counting pulse is input, the values for the possible counter reading and the values for the possible speed are reset to the current actual values for the speed and the position. The described linear or parabolic profile therefore applies in certain sections during those cycles in which no new counting pulse is registered.

One embodiment which can also be advantageously implemented in an FPGA is therefore obtained in that, in the first step, in the case of a newly detected counting pulse a timestamp is detected, where a value for the current clock rate is calculated from the difference between the timestamps of the two counting pulses detected last and, in the second step, a value range for a current counter reading that is permitted in each case with respect to the respective current time is updated based on the current counter reading of the incremental counter, on the basis of the difference between a current time and the timestamp detected last, based on the determined value for the clock rate and based on the minimum value and maximum value for the possible or permitted change in the clock rate per time unit, after which the respective current counter reading is compared with the value range. In the event of the respective current counter reading not being in the value range, implausibility is detected and/or signaled. The embodiment of the method which is obtained in this way can be processed repeatedly in a single FPGA cycle, where the computing operations that are used mostly, specifically the updating of the values for the respectively permitted counter reading and the maximum possible speed that occurs as a result of the integration of the permitted acceleration, can be performed out by pure addition operations that can be easily implemented in FPGAs and other processor-like modules. The necessary division operations (formation of reciprocal values) for determining a clock rate or speed can advantageously be implemented by calls in a value table, where, under certain circumstances, it is possible to interpolate between adjacent table values. For example, in one particularly advantageous embodiment the reciprocal values with a power of two, i.e., individual bits of a byte value or of a data word, can be read out of a table. As a result, the execution of a real division operation with respect to the running time can be avoided. The method of the present embodiment can particularly advantageously be implemented in a logic module by using fixed-point variables for the clock rate, the current speed and the current counter reading that is permitted in each case with respect to the current time.

In a further advantageous embodiment, not only minimum values and maximum values for the possible or permitted acceleration of the mechanical system or the clock rate resulting therefrom are predefined but also limits for the maximum or minimum speed or the maximum or minimum possible or permitted clock rate resulting therefrom. Furthermore, in a further advantageous embodiment it is possible to perform checking of a third order ("back-checking") which, however, requires the evaluation device to have sufficient computing power to be able to cope with this in a correspondingly short working cycle. Furthermore, this would require corresponding limiting values to be defined, i.e., it would be necessary to obtain information about the expected constancy of the detected signal.

In one advantageous embodiment, the contents of the variable, in particular the variable for the current clock rate, the permitted counter reading and advantageously also for the maximum and minimum possible clock rate/speed, are reset with each counting pulse that is detected as valid. As a result, the numerical values that inevitably differ from reality during the integration can be "captured" again.

A cycle counter can advantageously be used as a time base for the calculation of the clock rate/speed, where the cycle counter is correspondingly incremented with each pass of the method or each working cycle of an FPGA or of another evaluation device. As a result, it is possible to dispense with the provision or with the interrogation of an external time module. The method in accordance with the disclosed embodiments is also advantageously equipped with checking of the "comparison window", which ensures that the system does not enter a state in which a change in the speed is possible in principle only via a counting pulse that is interpreted as implausible. In principle, the cycle speed of the checking algorithm must always be higher than the highest expected signal frequency or the highest expected clock rate of the counting pulses. The higher the cycle speed of the checking algorithm, and therefore the more places after the decimal point in the variables used in the algorithm, the more precise the plausibility checking can be performed.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

BRIEF DESCRIPTION OF THE DRAWINGS

An exemplary embodiment of the method in accordance with the invention is explained below based on the drawings. The exemplary embodiment serves at the same time as an exemplary embodiment for an evaluation device in accordance with the invention, in which:

FIG. 2 shows a simplified representation of register contents and variable contents for a number of cycles of the method in accordance with the invention.

DETAILED DESCRIPTION OF THE PREFERRED EMBODIMENTS

In the text which follows, for purposes of simplicity the method is presented only in a simplified version with only one counting direction. It should be noted that expansion to counting "in both directions" is possible, but it requires, however, a quadrature signal or some other signal that indicates whether an incoming counting pulse is to cause the incremental counter to increment or decrement.

Figure 1:
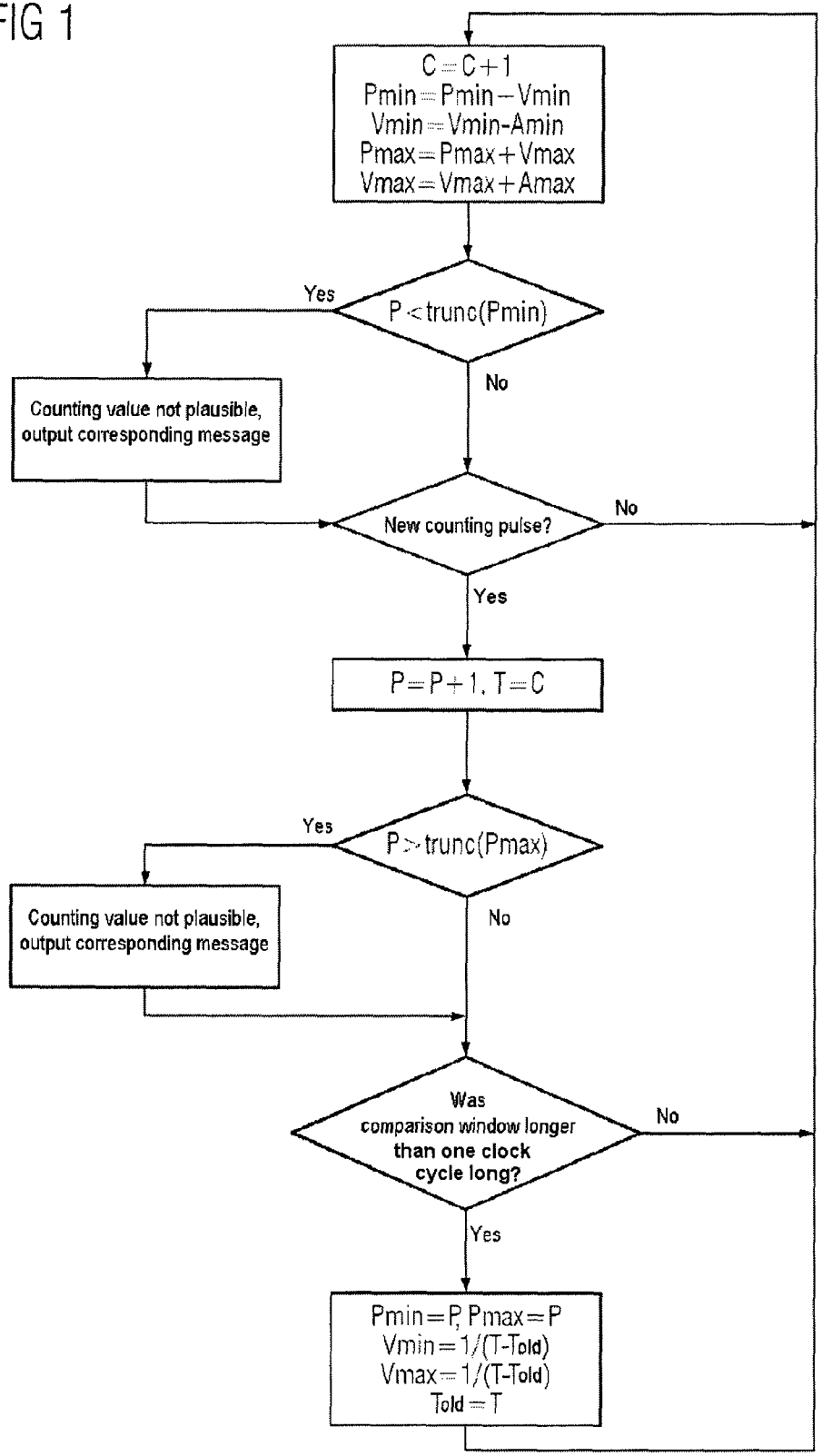
FIG. 1 shows a flowchart of the method in accordance with the invention.

FIG. 1 is a simplified flowchart of the method in accordance with the invention, where in practice there is provision that the method and therefore the flowchart are performed cyclically. In FIG. 1, the variable C indicates a system clock, i.e., a clock counter that is incremented with each pass of the method and whenever the flowchart is processed (top instruction in FIG. 1). The variable P constitutes the current counter value of the incremental counter. The variable T serves as a timestamp of the counting pulse that has been input last. As a result, the variable T contains the same value that the variable C had in the same cycle in which the counter P was last incremented. The variable $T_{old}$ contains the stamp of the last but one counting pulse (see instruction in the bottom block in the diagram in FIG. 1). The abovementioned variables do not have any places after the decimal point, and therefore constitute integers.

Furthermore, variables with places after the decimal point are also used in the diagram in FIG. 1, where in one advantageous improvement of this exemplary embodiment fixed-point variables are used. In this context, the variable $P_{min}$ denotes an integration accumulator of the counting module that specifies the limitation of the permitted values in the "downward" direction (minimum counter reading). The value for $P_{min}$ therefore changes with each cycle by the minimum possible (permitted) speed in the respective cycle. This is given in the variable $V_{min}$, and is also constructed as an "integration accumulator". With each cycle, the content of this variable changes by the minimum possible acceleration that is predefined in the constant $A_{min}$ by the user, as a function of the dynamic properties of a mechanical system which is used as the basis. In a way analogous to $P_{min}$, $V_{min}$ and $A_{min}$, the fixed-point variables $P_{max}$, $V_{max}$ and $A_{max}$ contain the respective maximum values for the permitted counter reading, the maximum (theoretically) possible speed (clock rate) and the predefined maximum permitted acceleration (rate of change of the clock rate).

In a first step of the flowchart, the system clock (variable C) is, as already mentioned, firstly incremented, after which the now current new contents of the variables $P_{min}$, $V_{min}$, $P_{max}$ and $V_{max}$ are calculated. In this context, it is assumed that starting from a previously valid, maximum permitted counter reading $P_{min}$, the latter has changed at least by a minimum speed $V_{min}$ in the new cycle. Likewise, a new minimum speed $V_{min}$ is calculated, where it is assumed that the previously valid and minimum possible speed $V_{min}$ is reduced at least by a maximum permitted or possible deceleration rate $A_{min}$. Although a subtraction was performed in this respect in FIG. 1, in another convention it is also possible to use an addition for the sign of the minimum permitted acceleration or deceleration $A_{min}$; this convention is used in FIG. 2. The values for $P_{max}$ and $V_{max}$ are calculated in a way analogous to the previously discussed variables $P_{min}$, $V_{min}$.

Subsequently, a check is performed to determine whether the condition of the minimum acceleration has been infringed. The content of the counting variable P is, for technical reasons, always integral. As a result, the content of variable P is compared with the places before the decimal point of the integration accumulator $P_{min}$. This can be implemented by truncating the variable $P_{min}$ for the comparison. If the comparison condition is infringed, an implausible counting value is detected, which causes a corresponding message to be output in the flowchart of FIG. 1. However, of course, the binary information relating to the presence of an error or of implausibility can also cause any other desired reactions.

A check is now performed to determine whether a new counting pulse has been input. This can be done by interrogating an external counter register, an interrupt register ("counting flag") or in some other way. If this is not the case, the present processing cycle of the method is ended; in the diagram in FIG. 1 branching "in the upward direction" occurs. Otherwise, the incremental counter is incremented by "1" and a new timestamp is stored in the variable T. Next, a check to determine whether the incremental counter P exceeds the permitted current maximum value $P_{max}$ is performed, where truncation is also used again here. In the event of infringement of the criterion, implausibility is also detected and a corresponding message is output or some other measure is taken. In particular, in the event of implausibility a subsequent processing stage, which uses the counting register P, is informed. Such a processing stage can be, in particular, a stored-program controller for controlling movement of a mechanical system, a computer or the like.

A check is subsequently performed to determine whether the "comparison window" has lasted longer than a clock cycle. In the case of high speeds of the mechanical system or in the case of a slow cycle speed of the checking algorithm the following situation may occur: if the range that is calculated according to the calculated $P_{min}$ and $P_{max}$ and in which counting pulses are interpreted as plausible is just a single FPGA clock cycle long, the speed of the mechanical system could never change without an implausible counting pulse being detected. This is because a counting pulse which would arrive at precisely the expected FPGA clock cycle would again cause the same starting values for $V_{min}$ and $V_{max}$, which in turn would cause the same values of $P_{min}$ and $P_{max}$, which again permit a plausible counting pulse at only precisely one FPGA clock cycle. This problem is caused by the fact that during the calculation $V=1/(T-T_{old})$ a certain degree of imprecision always arises as a result of the discrete FPGA clock cycle. For this reason, if a corresponding situation is detected, the registers $V_{min}$, $V_{max}$ etc. are not reset, with the result that, in particular, their places after the decimal point are retained and the described undesired situation does not occur. If, given configuration of the system based on the known system parameters, it can be concluded that this situation can in principle never occur, this cyclic checking can, of course, be dispensed with.

The method step presented last at the bottom of the flowchart shown in FIG. 1 serves for resetting the variables $P_{min}$, $P_{max}$, $V_{min}$, $V_{max}$. Furthermore, the timestamp of the "last but one" counting pulse, specifically $T_{old}$, is stored. Therefore, a cycle of the method in accordance with the invention is processed. As a result, a maximum value ($P_{max}$) and a minimum value ($P_{min}$) for the position and therefore for the contents of the counting register P are available in each clock cycle of the processing, where this data can be used for performing plausibility checking of each individual counting pulse.

A sequence of 21 cycles is presented, for example in FIG. 2, where the starting value of the incremental counter P is pre-assigned the number 5000. It is assumed that in this cycle "zero" a pulse was detected. The actual speed (clock rate) $V_{act}$ is pre-assigned as 0.1, that also applies for $V_{max}$. Correspondingly, in this cycle the number which is reduced by $V_{min}$, and which can be found in the register P, correspondingly occurs as the minimum permitted counter value $P_{min}$, while the maximum permitted position of the counting register $P_{max}$ is composed of the content of the counting variable P increased by the maximum possible or permitted speed $V_{max}$. The truncation values for $P_{min}$, $P_{max}$ are then also represented on that line. Lastly, a check is performed to determine whether the content of the variable P (here: 5000) lies within the window spanned by the truncation values of $P_{min}$, $P_{max}$, which is inevitably the case here owing to the starting situation, with the result that a fault is not detected.

In the next cycle with the number 1, a pulse is not input, with the result that the registers for $V_{min}$, $V_{max}$, $P_{min}$, $P_{max}$ are updated (integrated) in accordance with the computing rule from FIG. 1 (with the exception of the modified sign for $A_{min}$). In this context, it is clearly apparent that the permitted minimum speed drops because a maximum deceleration which is different from zero, specifically $A_{min}$, is predefined as a constant. Correspondingly, on the other hand, the maximum permitted or possible clock rate or speed $V_{max}$ is increased with respect to the previous value by the addition of the permitted acceleration $A_{max}$. On the other hand, the actual speed or clock rate $V_{act}$ does not change because no new pulse has been input and, therefore, no new reciprocal value can be calculated from the time interval of the pulses that are input last. In this cycle, too, the current counter reading is within the scope of the tolerated window.

This does not change until the cycle with the number 5 in which a pulse is input. However, according to the truncated variable $P_{max}$ it is expected that here a pulse still cannot have been input owing to the dynamic properties which are predefined. A fault is therefore detected. The new pulse would have firstly had to be input in the next cycle with the number 6 at which the truncated value for $P_{max}$ jumps to 5001.

Since the time interval between the pulses which are input last is five cycles, the calculated actual (new) speed $V_{act}$ is then 0.2. The registers $V_{min}$, $V_{max}$ are reset to this value.

The method is now continued further, where the next error is detected in the cycle 14, because here the next counting pulse should already have been input (the truncation of $P_{min}$ is incremented by one counter, but the next counting pulse has not yet been input).

Slight variations of the method can result, for example, from the fact that in the programmed sequence the calculation of minimum values and maximum values for the counting register P ($P_{min}$, $P_{max}$) can be performed at the start or at the end of a processing cycle. The resulting deviations are therefore smaller the higher the clock rate of the method in comparison with the clock rate of the counting pulse. However, it is important that as long as no new counting pulse is input, the range between the theoretically possible speeds $V_{min}$, $V_{max}$ and between the permitted, theoretically possible counter reading $P_{min}$, $P_{max}$ becomes larger and larger.

Figure 3:
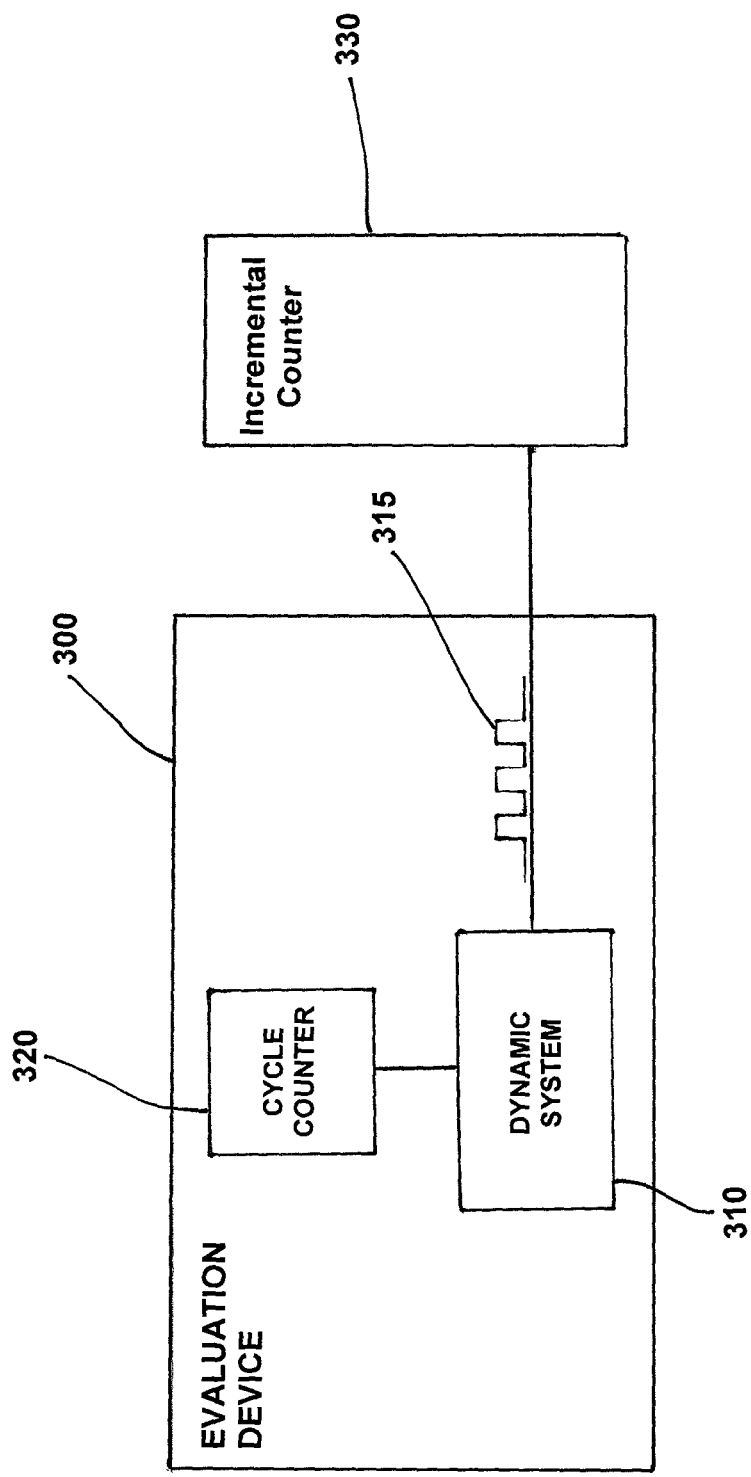
FIG. 3 is a schematic block diagram of the an evaluation device in accordance with the invention.

FIG. 3 is a schematic block diagram of an evaluation device 300 for checking plausibility of an incremental counter 350, where counting pulses are detectable via the incremental counter. The evaluation device comprises a dynamic system 310 for generating the counting pulses 315 with a clock rate corresponding to a state of the dynamic system. Here, a minimum value and a maximum value for a possible or permitted change in the clock rate per time unit is predefined based on operating limits.

In accordance with the invention, the evaluation device 300 is configured such that a current clock rate is calculated in each case from two counting pulses respectively detected last, where implausibility is detected if the difference between the clock rate calculated during the newly detected counting pulse and the clock rate calculated immediately beforehand is not within the limits defined by the minimum value and maximum value.

In accordance with the invention, the evaluation device 300 is configured such that a current clock rate is calculated in each case from two counting pulses respectively detected last, where implausibility is detected if the difference between the clock rate calculated during the newly detected counting pulse and the clock rate calculated immediately beforehand is not within the limits defined by the minimum value and maximum value.

In alternative embodiments, the evaluation device 300 is configured such that during the calculation, in a case of a newly detected counting pulse a timestamp is detected, where a value for the current clock rate is calculated from a difference between timestamps of the two counting pulses detected last, and during the check, a value range for a current counter reading that is permitted in each case with respect to the respective current time is updated based on (i) a current counter reading of the incremental counter, (ii) a difference between a current time and a timestamp detected last, a determined value for the clock rate and based on the minimum value and (iii) maximum value for the possible or permitted change in the clock rate per time unit, after which a respective current counter reading is compared with a value range, where in the event of the respective current counter reading not being in the value range, implausibility is at least one of detected and signaled.

In another embodiment, the evaluation device 300 is configured such that the plausibility checking during the check performs a comparison of a respectively determined value for a current clock rate with a further minimum value and a further maximum value, predefined based on operating limits of the dynamic system 315, for a possible or permitted minimum and maximum clock rate per time unit.

In other embodiments, the evaluation device 300 is configured such that the plausibility checking during the check performs a comparison of a respectively determined value for a current clock rate with a further minimum value and a further maximum value, predefined based on operating limits of the dynamic system 315, for a possible or permitted minimum and maximum clock rate per time unit.

In yet another embodiment, a value range for a current counter reading that is permitted in each case with respect to a respective current time is defined by a content of, in each case, one variable for a minimum permitted counter reading and a maximum permitted counter reading; where the evaluation device 300 is further configured such, during the check, updating of the value range is performed by adding the minimum or maximum value multiplied by a time which has passed since a last update to a respective previous content of the variable.

In a further embodiment, the evaluation device 300 is configured such that contents of the variable are reset to a current counter reading upon detection of a new counting pulse which is detected as plausible.

In a still further embodiment, the evaluation device 300 is configured to repeat the method in accordance with the invention cyclically.

In yet another embodiment, a cycle counter 320 which is to be incremented with each cycle is defined within the evaluation device 300, where the cycle counter is utilizable as a time base for calculation of the clock rate.

In a still further embodiment, the evaluation device comprises a programmable logic module; where calculations performed for the plausibility check are defined via a logic program.

By means of the above-described embodiments of the method in accordance with the invention and by means of a corresponding evaluation device, which can be implemented, in particular, by an FPGA, implausible counting pulses, which occur, for example, owing to interference, can be detected. Likewise, counting pulses that are not registered for reasons of interference can also be detected. The plausibility checking of each counting pulse that is input, and not, for example, of a relatively large number of counting pulses which are input in a relatively large time window, permits the reliability of the plausibility checking to be improved compared to the prior art.

While there have been shown, described and pointed out fundamental novel features of the invention as applied to a preferred embodiment thereof, it will be understood that various omissions and substitutions and changes in the form and details of the methods described and the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. A method for checking plausibility of an incremental counter, counting pulses being detected via an incremental counter, a dynamic system generating the counting pulses with a clock rate corresponding to a state of the dynamic system, a minimum acceleration/deceleration value and a maximum acceleration/deceleration value for a possible or permitted change in the clock rate per time unit being predefined on the basis of operating limits of the dynamic system, the method comprising:

calculating a current clock rate in each case from two last detected counting pulses, respectively; and checking said counting pulse at each newly detected counting pulse to determine whether a difference between a clock rate calculated during a newly detected counting pulse and a clock rate calculated immediately beforehand is within acceleration/deceleration limits defined by the minimum acceleration/deceleration value and the maximum acceleration/deceleration value;

wherein implausibility is detected if the difference between the clock rate calculated during the newly detected counting pulse and the clock rate calculated immediately beforehand is not within the acceleration/deceleration limits defined by the minimum acceleration/deceleration value and the maximum acceleration/deceleration value.

2. The method as claimed in claim 1, further comprising:
detecting a timestamp in a case of a newly detected counting pulse during said calculating step;
calculating a value for a current clock rate from a difference between timestamps of the two counting pulses detected last; and
updating, during the checking step, a value range for a current counter reading which is permitted in each case with respect to a respective current time based on a current counter reading of the incremental counter, the difference between a current time and the timestamp detected last, based on the determined value for the clock rate and based on the minimum acceleration/deceleration value and maximum acceleration/deceleration value for the possible or permitted change in the clock rate per time unit, after which the respective current counter reading is compared with the value range;
wherein in an event of a respective current counter reading not being in the value range, implausibility is at least one of detected and signaled.

3. The method as claimed in claim 1, wherein plausibility checking during said checking step performs a comparison of the respectively determined value for the current clock rate with a further minimum acceleration/deceleration value and a further maximum acceleration/deceleration value, predefined based on operating limits of the dynamic system, for a possible or permitted minimum and maximum clock rate per time unit.

4. The method as claimed in claim 2, wherein plausibility checking during said checking step performs a comparison of the respectively determined value for the current clock rate with a further minimum acceleration/deceleration value and a further maximum acceleration/deceleration value, predefined based on operating limits of the dynamic system, for a possible or permitted minimum and maximum clock rate per time unit.

5. The method as claimed in claim 2, wherein the value range for the current counter reading which is permitted in each case with respect to the respective current time is defined by a content of, in each case, one variable for a minimum permitted counter reading and a maximum permitted counter reading;
wherein, during said checking step, the updating of the value range is performed by adding the minimum acceleration/deceleration or the maximum acceleration/deceleration value multiplied by a time which has passed since a last update to a respective previous content of the variable.

6. The method as claimed in patent claim 5, wherein contents of the variable are reset to a current counter reading with a detection of a new counting pulse which is detected as plausible.

7. The method as claimed in claim 1, wherein the calculating and checking steps are performed in a cyclically repeating manner.

8. The method as claimed in patent claim 7, wherein a cycle counter is incremented with each cycle; and wherein the cycle counter is utilized as a time base for calculation of the clock rate.

9. An evaluation device for checking plausibility of an incremental counter, counting pulses being detectable via the incremental counter, comprising:

a dynamic system for generating the counting pulses with a clock rate corresponding to a state of the dynamic system;

wherein a minimum acceleration/deceleration value and a maximum acceleration/deceleration value for a possible or permitted change in the clock rate per time unit is predefined based on operating limits;

wherein the evaluation device is configured such that a current clock rate is calculated in each case from two last detected counting pulses, respectively; and wherein implausibility is detected if the difference between the clock rate calculated during the newly detected counting pulse and the clock rate calculated immediately beforehand is not within the limits defined by the minimum acceleration/deceleration value and the maximum acceleration/deceleration value.

10. The evaluation device as claimed in claim 9, wherein the evaluation device is configured such that:

during the calculation, in a case of a newly detected counting pulse a timestamp is detected, wherein a value for the current clock rate is calculated from a difference between timestamps of the two counting pulses detected last; and during said check, a value range for a current counter reading which is permitted in each case with respect to the respective current time is updated based on a current counter reading of the incremental counter, a difference between a current time and a last detected timestamp, a determined value for the clock rate and based on the minimum acceleration/deceleration value and the maximum acceleration/deceleration value for the possible or permitted change in the clock rate per time unit, after which a respective current counter reading is compared with a acceleration/deceleration value range, wherein in the event of the respective current counter reading not being in the value range, implausibility is at least one of detected and signaled.

11. The evaluation device as claimed in patent claim 9, wherein the evaluation device is configured such that the plausibility checking during the check performs a comparison of a respectively determined value for a current clock rate with a further minimum acceleration/deceleration value and a further maximum acceleration/deceleration value, predefined based on operating limits of the dynamic system, for a possible or permitted minimum and maximum clock rate per time unit.

12. The evaluation device as claimed in patent claim 10, wherein the evaluation device is configured such that the plausibility checking during the check performs a comparison of a respectively determined value for a current clock rate with a further minimum acceleration/deceleration value and a further maximum acceleration/deceleration value, predefined based on operating limits of the dynamic system, for a possible or permitted minimum and maximum clock rate per time unit.

13. The evaluation device as claimed in claim 9, wherein a value range for a current counter reading which is permitted in each case with respect to a respective current time is defined by a content of, in each case, one variable for a minimum permitted counter reading and a maximum permitted counter reading; wherein the evaluation device is configured such, during the check, updating of the value range is performed by adding the minimum acceleration/deceleration or the maximum acceleration/deceleration value multiplied by a time which has passed since a last update to a respective previous content of the variable.

14. The evaluation device as claimed in claim 9, wherein the evaluation device is configured such that contents of the variable are reset to a current counter reading upon detection of a new counting pulse which is detected as plausible.

15. The evaluation device as claimed in claim 9, wherein the evaluation device is configured to repeat method steps cyclically.

16. The evaluation device as claimed in claim 9, wherein a cycle counter which is to be incremented with each cycle is defined within the evaluation; and wherein the cycle counter is utilizable as a time base for calculation of the clock rate.

17. The evaluation device as claimed in claim 9, wherein the evaluation device comprises a programmable logic module; and wherein calculations performed for the plausibility check are defined via a logic program.

\* \* \* \* \*